United States Patent
Haskett et al.

(10) Patent No.: US 7,402,458 B2
(45) Date of Patent: Jul. 22, 2008

(54) STRESS RELIEVED FLAT FRAME FOR DMD WINDOW

(75) Inventors: Bradley Morgan Haskett, Allen, TX (US); John Patrick O'Connor, Fort Worth, TX (US); Steven E. Smith, Coppell, TX (US); Mark Myron Miller, Plano, TX (US); Ivan Kmecko, Dallas, TX (US); Jwei Wien Liu, Plano, TX (US); Edward Carl Fisher, Lucas, TX (US); Frank O. Armstrong, Wylie, TX (US); Daniel C. Estabrook, Plano, TX (US); Jeffrey E. Faris, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 322 days.

(21) Appl. No.: 11/118,854

(22) Filed: Apr. 28, 2005

(65) Prior Publication Data

US 2005/0185252 A1   Aug. 25, 2005

Related U.S. Application Data

(62) Division of application No. 10/143,232, filed on May 10, 2002, now Pat. No. 6,894,853.

(51) Int. Cl.
*H01L 21/50* (2006.01)
*H01L 21/48* (2006.01)
*H01L 21/44* (2006.01)
*H01L 23/29* (2006.01)
*H01L 23/31* (2006.01)

(52) U.S. Cl. .................. 438/106; 438/124; 438/27; 257/E23.118; 257/E23.124

(58) Field of Classification Search ............... 438/106, 438/124, 127; 257/E23.118, E23.124, E23.135
See application file for complete search history.

(56) References Cited

U.S. PATENT DOCUMENTS

| | | | |
|---|---|---|---|
| 5,508,740 A | 4/1996 | Miyaguchi et al. | |
| 5,936,758 A | 8/1999 | Fisher et al. | |
| 6,028,351 A | 2/2000 | Klonis et al. | |
| 6,323,982 B1 | 11/2001 | Hornbeck | |
| 6,627,814 B1 | 9/2003 | Stark | |
| 6,639,313 B1 | 10/2003 | Martin et al. | |
| 6,661,668 B2 * | 12/2003 | Weiblen | 361/730 |

FOREIGN PATENT DOCUMENTS

| | | | | |
|---|---|---|---|---|
| JP | 55-166939 | | 12/1980 | |
| JP | 355157243 A | * | 12/1980 | 257/E31.118 |
| JP | 356008853 A | * | 1/1981 | 257/704 |
| JP | 56-56656 | | 5/1981 | |
| JP | 361012048 A | * | 1/1986 | 257/680 |

* cited by examiner

*Primary Examiner*—Luan Thai
(74) *Attorney, Agent, or Firm*—W. James Brady, III; Frederick J. Telecky, Jr.

(57) ABSTRACT

An improved window frame and window piece for a micromirror assembly is disclosed herein. The window frame includes a stress-relieving contour positioned in the middle of the frame that can absorb the mechanical stresses applied to the window frame from the ceramic base and from the window piece. The window frame may be comprised of a single piece of sheet metal that has been stamped to include a stress-relieving contour. The stress-relieving contour may be comprised of a variety of shapes, including a "U" shape, an inverted "U" shape, a curved step shape, or other combinations thereof.

8 Claims, 8 Drawing Sheets

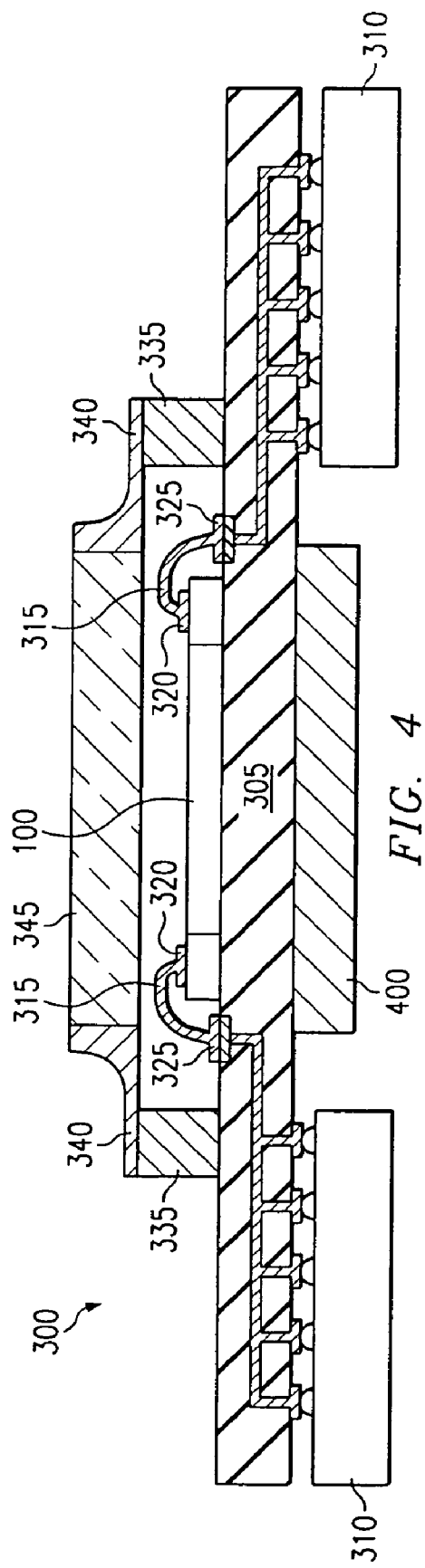
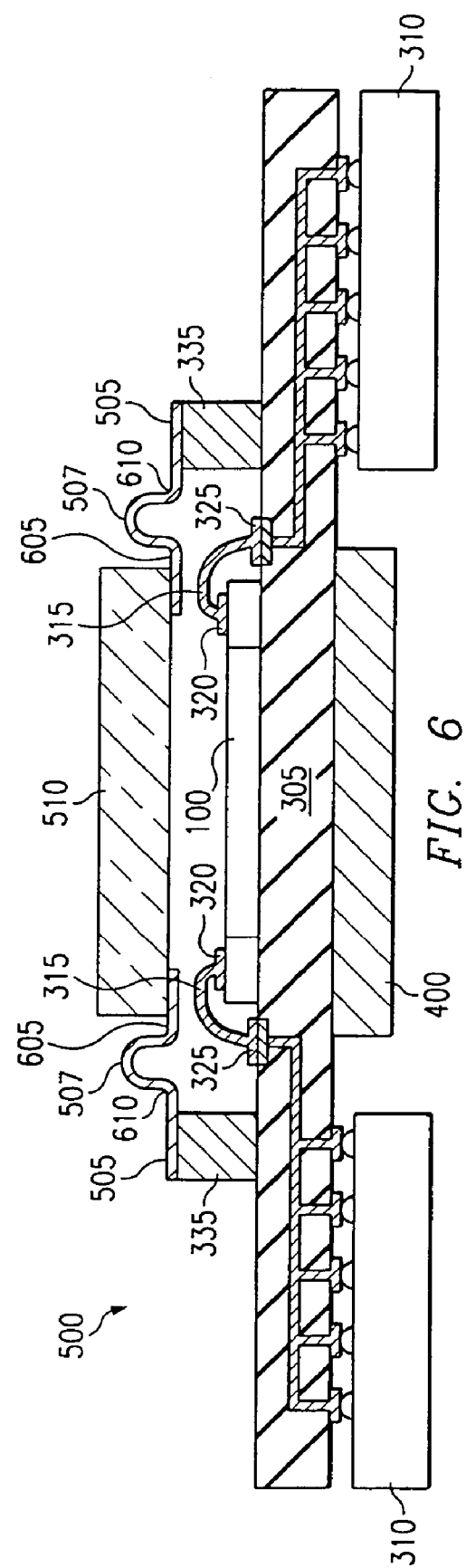
FIG. 4 (PRIOR ART)
FIG. 6

STRESS RELIEVED FLAT FRAME FOR DMD WINDOW

This application is a Divisional of application Ser. No. 10/143,232, filed May 10, 2002 now U.S. Pat. No. 6,894,853.

BACKGROUND

Micromechanical devices are small structures typically fabricated on a semiconductor wafer using techniques such as optical lithography, doping, metal sputtering, oxide deposition, and plasma etching similar to those developed for the fabrication of integrated circuits. Digital micromirror devices (DMDs), sometimes referred to as deformable micromirror devices, are a type of micromechanical device. Other types of micromechanical devices include accelerometers, pressure and flow sensors, gears and motors.

Digital micromirror devices have been utilized in optical display systems. In these display systems, the DMD is a light modulator that uses digital image data to modulate a beam of light by selectively reflecting portions of the beam of light to a display screen. While analog modes of operation are possible, DMDs typically operate in a digital bistable mode of operation and as such are the core of many digital full-color image projection systems.

Micromirrors have evolved rapidly over the past ten to fifteen years. Early devices used a deformable reflective membrane that, when electrostatically attracted to an underlying address electrode, dimpled toward the address electrode. Schieren optics illuminate the membrane and create an image from the light scattered by the dimpled portions of the membrane. Schieren systems enabled the membrane devices to form images, but the images formed were very dim and had low contrast ratios, making them unsuitable for most image display applications.

Later micromirror devices used flaps or diving board-shaped cantilever beams of silicon or aluminum, coupled with dark-field optics to create images having improved contrast ratios. Flap and cantilever beam devices typically used a single metal layer to form the top reflective layer of the device. This single metal layer tended to deform over a large region, however, which scattered light impinging on the deformed portion. Thin hinge structures, which restrict the deformation to a relatively small region of the device, limit the amount of light scattered and improve image quality.

Torsion beam devices enabled the use of dark field optical systems. Torsion beam devices use a thin metal layer to form a torsion beam, which is referred to as a hinge, and a thicker metal layer to form a rigid member, or beam, typically having a mirror-like surface. The rigid member or mirror is suspended by, and typically centered on, the torsion hinge-allowing the mirror to rotate by twisting the torsion hinge. Address electrodes are formed on the substrate beneath the mirror on either side of the torsion hinge axis. Electrostatic attraction between an address electrode and the mirror, which in effect form the two plates of an air gap capacitor, is used to rotate the mirror about the longitudinal axis of the hinge.

Recent micromirror configurations, called hidden-hinge designs, further improve the image contrast ratio by using an elevated mirror to block most of the light from reaching the torsion beam hinges. The elevated mirror is connected to an underlying torsion beam or yoke by a support post. The yoke is attached to the torsion hinges, which in turn are connected to rigid support posts. Because the structures that support the mirror and allow it to rotate are underneath the mirror instead of around the perimeter of the mirror, virtually the entire surface of the device is used to fabricate the mirror. Since virtually all of the light incident on a hidden-hinge micromirror device reaches an active mirror surface-and is thus either used to form an image pixel or is reflected away from the image to a light trap-the hidden-hinge device's contrast ratio is much higher than the contrast ratio of previous devices.

Images are created by positioning the DMD so that a light beam strikes the DMD at an angle equal to twice the angle of rotation. In this position, the mirrors fully rotated toward the light source reflect light in a direction normal to the surface of the micromirror device and into the aperture of a projection lens-transmitting light to a pixel on the image plane. Mirrors rotated away from the light source reflect light away from the projection lens-leaving the corresponding pixel dark.

Full-color images are generated either by using three micromirror devices to produce three single-color images, or by sequentially forming three single-color images using a single micromirror device illuminated by a beam of light passing through three color filters mounted on a rotating color wheel.

An example of a small portion of a digital micromirror array is depicted in FIG. 1. In FIG. 1, a small portion of a digital micromirror array 100 with several mirrors 102 is depicted. Some of the mirrors 102 have been removed to show the underlying structure of the DMD array. FIG. 2 is an exploded close-up of one individual mirror 102 of a DMD array. The electrical interconnections and operations of the individual micromirrors 102 are described in further detail in U.S. Pat. No. 6,323,982 entitled Yield Superstructure for Digital Micromirror Device to Larry J. Hornbeck, which is hereby incorporated by reference.

A representative example of an existing spatial light modulator (SLM) device 300 is depicted in FIG. 3. In FIG. 3, a micromirror array 100 is mounted onto a ceramic base 305, which is further mounted onto a printed circuit board (PCB) or electronic lead package 310. The micromirror array 100 is electrically connected to the ceramic base 3 05 by a series of leads 315. Each of the leads 315 is connected to the micromirror array 100 at bonding pads 320 that are integral to the micromirror array 100. At the other end, the leads 315 are connected to bonding pads 325, which are integral to the ceramic base 305. Each of the bonding pads 325 on the ceramic base 305 is connected to a series of land grid array (LGA) pads on the bottom of the ceramic base 305 through internal interconnect layers that are built into the ceramic base. The LGA pads may then be connected to the PCB 310 via elastomer or C-spring connectors. In order to ensure a reliable electrical connection between the ceramic base 305 and the PCB 310, a mechanical loading must be applied between the ceramic base 305 and the PCB 310. FIG. 3 describes only one representative embodiment for electrically connecting the micromirror array 100. Other suitable arrangements for electrically connecting the micromirror array 100 are well known in the art.

The micromirror array 100 depicted in FIG. 3 is hermetically sealed in the SLM device 300 to prevent the array 100 from becoming damaged. To accomplish this, a seal ring 335 is disposed on the ceramic base 305 so that the micromirror array 100 is surrounded. A window frame 340, which incorporates an optically transparent piece 345, is mounted onto the seal ring 335 to form a seal that encases the micromirror array 100. The window frame 340 comprises a single block of metal or other suitable material that has been formed through forging or CNC machining. The transparent piece 345 is typically a piece of glass, or other optically transmissive material, that is mounted and sealed into the window frame 340. The window frame 340 is mounted onto the seal ring 335 by seam welding or other suitable processes that forms a seal between the seal ring 335 and the frame 340.

A cross-sectional view of the SLM device 300 depicted in FIG. 3 along the axis I-I is depicted in FIG. 4. Many of the same components described above (the micromirror array 100, the ceramic base 305, the electronic lead package 310, the electronic leads 315, bonding pads 320 and 325, the seal ring 335, the window frame 340, and the transparent piece 345) are depicted in FIG. 4. Also depicted is a heat sink 400 that is mounted onto the bottom of the base 305. The heat sink 400 absorbs the heat generated by the micromirror array 100 when it is illuminated with a light source during its operation. Further details of the components and connections of a typical SLM device are described in U.S. Pat. No. 5,936,758 entitled Method of Passivating a Micromechanical Device Within a Hermetic Package to Edward C. Fisher, et al., which is hereby incorporated by reference.

A problem associated with existing SLM devices 300 occurs as the devices are subjected to thermal and mechanical stresses during the mounting and operating processes. For example, as the window frame 340 is seam welded onto the seal ring 335, a great deal of thermal and mechanical stresses are applied to the window frame 340. These stresses can weaken or break the seal between the window piece 345 and the window frame 340. Furthermore, as the SLP device 300 is mounted onto a printed circuit board 310 by applying a mechanical bias between the ceramic base 305 and the PCB 310, mechanical stresses are transferred to the seam weld between the seal ring 335 and the window frame 340 and to the seal between the window frame 340 and the window piece 345. In addition, as the SLM device 300 is illuminated and operated, a large amount of heat is generated by the DMD array 100, the window frame 340, and the window piece 345. This is particularly problematic when the coefficient of thermal expansion of the various components is not matched. This heat can induce mechanical stress on the seams and welds mentioned above. Accordingly, there is a need in the art for a window frame and window piece assembly that can relieve the mechanical stresses that arise during the mounting and operating processes of the SLM device 300.

BRIEF SUMMARY

An improved window frame and window piece for a spatial light modulator (SLM) is disclosed herein. The window frame includes a stress-relieving contour that can absorb the mechanical stresses applied to the window frame from the ceramic base and from the window piece. The window frame may be comprised of a single piece of sheet metal that has been stamped to include a stress-relieving contour. The stress-relieving contour may be comprised of a variety of shapes, including a "U" shape, an inverted "U" shape, a curved step, or other combinations thereof.

BRIEF DESCRIPTION OF TILE DRAWINGS

FIG. 4 is a cross-sectional view of a known spatial light modulator.

FIG. 6 is a cross-sectional view of a spatial light modulator that incorporates an improved window frame assembly.

DETAILED DESCRIPTION

Figure 3:
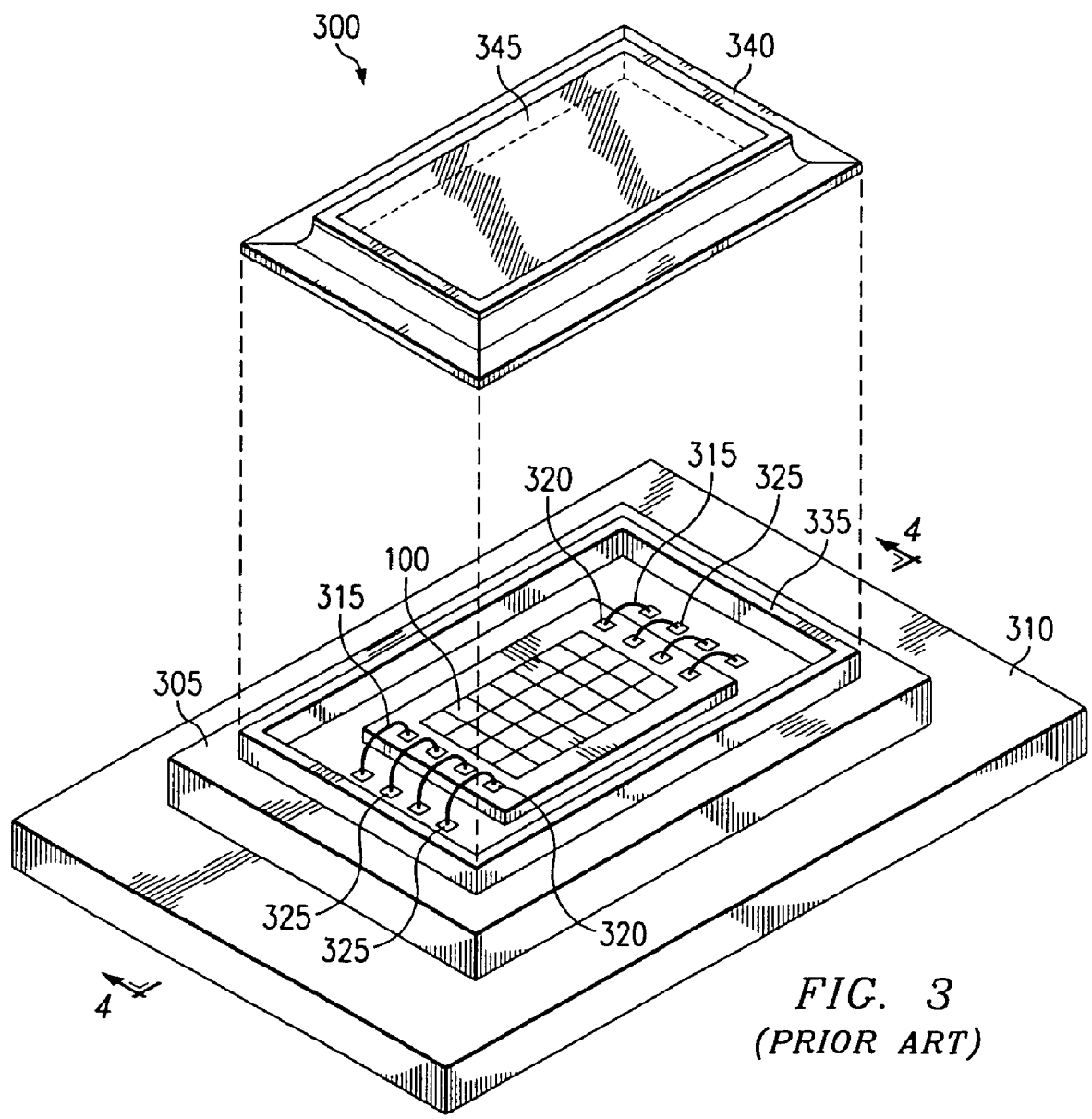
FIG. 3 is an exploded perspective view of a known spatial light modulator.
Figure 5:
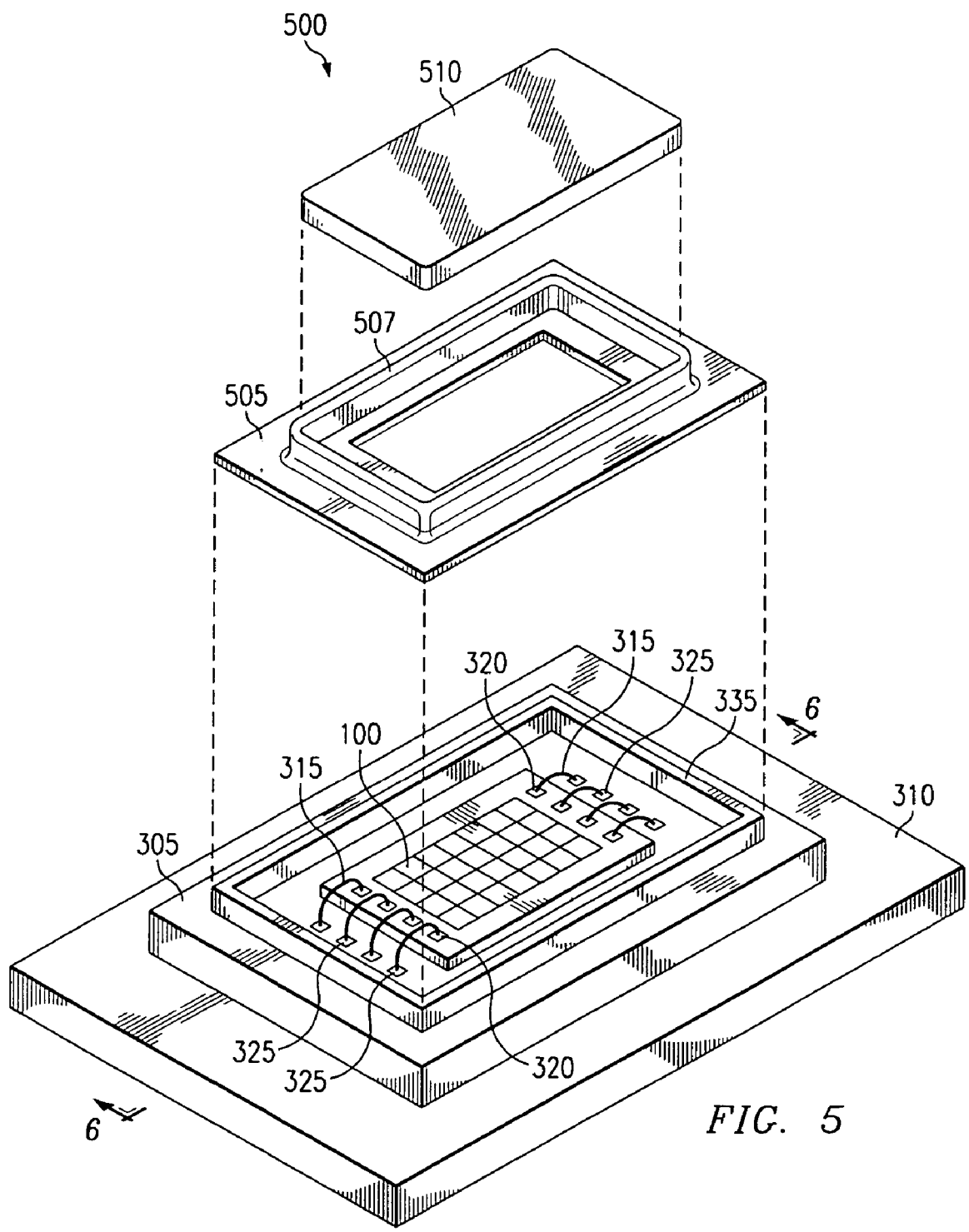
FIG. 5 is an exploded perspective view of a spatial light modulator that incorporates an improved window frame assembly.

An exploded view of one embodiment of an improved SLM device 500 is depicted in FIG. 5. In FIG. 5, much like FIG. 3, a micromirror array 100 is mounted onto a ceramic base 305 with electrical leads 315 attached to bonding pads 320 on the micromirror array 100. The ceramic base 305 is mounted onto a printed circuit board (PCB) electrical lead package 310, whereby the electrical leads 315 may be connected to the PCB 310 via the bonding pads 325 and the internal interconnect layers in the base 305. The improved SLM device 500 also includes a seal ring 335 that surrounds the micromirror array 100 so that an appropriate window frame may be attached thereto.

A window frame 505 having a contoured portion 507 is depicted in FIG. 5. A window piece 510 is mounted to the window frame 505 on the region inside of contoured portion. According to one embodiment, the window piece 510 is mounted onto the window frame 505 by brazing the pieces at a sufficient temperature to ensure a durable seal. Other suitable mounting processes include using glass frit, adhesives, solder-glass bonding and soldering. Generally, the window piece/window frame seal should be capable of meeting a leak rate of less than $5 \times 10^{-8}$ cc/sec helium leak rate after exposing the window piece/window frame assembly to 100 thermal cycles with −55° C. to 125° C. temperature extremes.

The window frame 505 is designed to be mounted onto the seal ring 335 by seam welding, or other appropriate sealing processes. The contoured portion 507 of the window frame 505 acts as a stress relieving feature by absorbing any mechanical stresses applied to the window frame by either the seal ring 335 or by the window piece 510. In this manner, the seam weld between the seal ring 335 and the window frame 505 and the seal between the window piece 510 and the window frame 505 are not subject to the same degree of stresses that are encountered by the window frame 340 depicted in FIGS. 3 and 4.

A cross-sectional view of the SLM device 500 depicted in FIG. 5 along the axis II-II is depicted in FIG. 6. Many of the same components described and depicted in FIG. 5 (the micromirror array 100, the ceramic base 305, the PCB 310, the electronic leads 315, bonding pads 320 and 325, the seal ring 335, the window frame 340 and the transparent piece 345) are depicted in FIG. 6. Also depicted is a heat sink 400 that is mounted onto the bottom of the base 305. The cross-sectional shape of the window frame 505 is depicted in FIG. 6 as being in the shape of an inverted "U". Furthermore, the inner portion of the window frame 605 is depicted as being substantially co-planar with the outer portion of the window frame 610.

Figure 1:
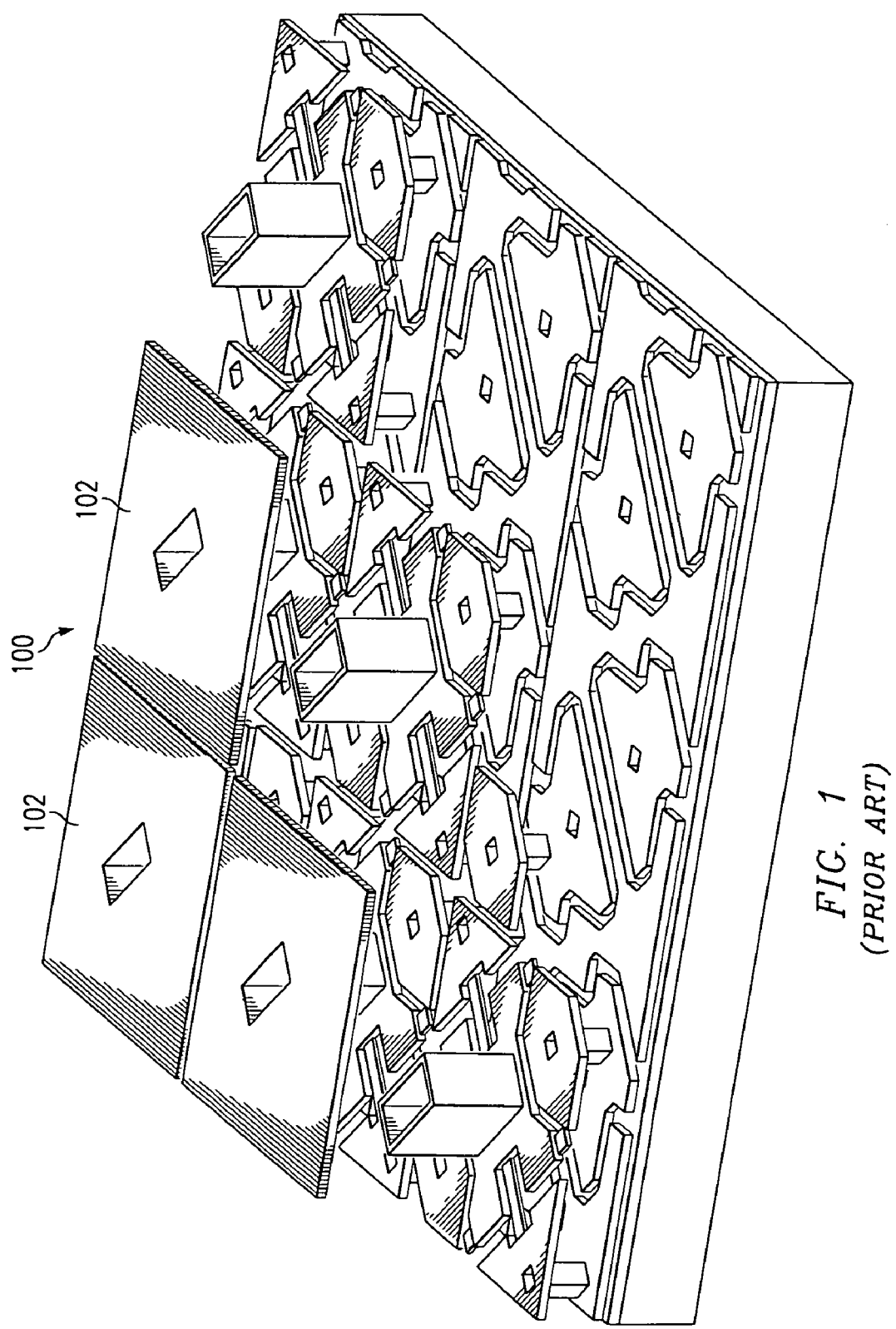
FIG. 1 is a perspective view of a portion of a micromirror array with some of the micromirrors removed.
Figure 2:
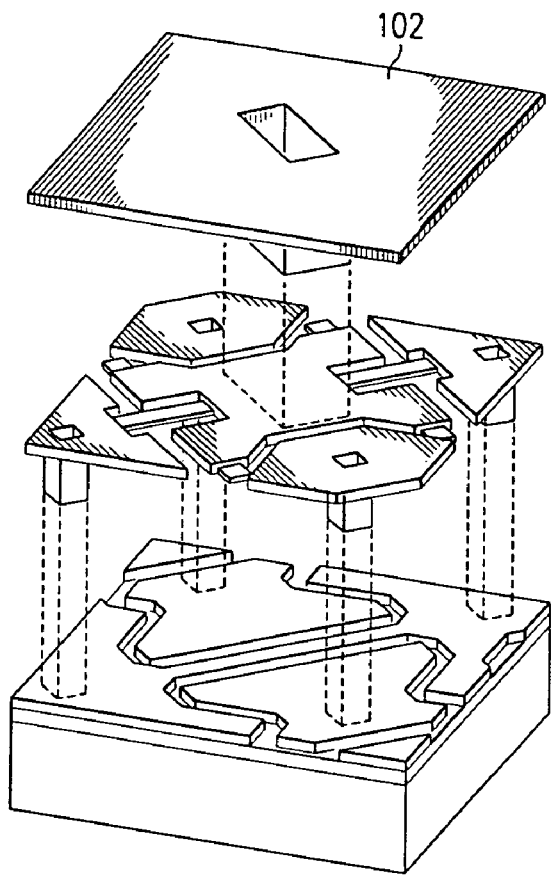
FIG. 2 is an exploded perspective view of a single micromirror assembly.
Figure 7A:
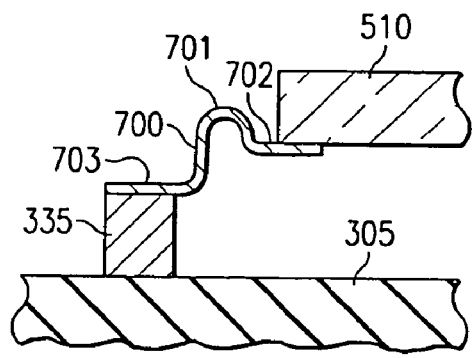
FIG. 7A is a cross-sectional view of a spatial light modulator that incorporates a first window frame embodiment.

Alternative embodiments for the window frame 505 are depicted in FIGS. 7A-7D. In FIG. 7A, a window frame 700 is depicted that connects the window piece 510 to the seal ring 335. Much like the window frame 505 depicted in FIG. 6, window frame 700 includes a contoured portion 701, an inner portion 702 that is connected to the window piece 510, and an outer portion 703 that is connected to the seal ring 335. The inner and outer portions (702, 703), however, are not coplanar. Instead, the inner portion 702 is located in a plane that is elevated in comparison to the outer portion 703. Elevating the inner portion 702 with respect to the outer portion 703 allows the seal ring 335 to be much smaller and allows for a larger hermetically sealed environment under the window piece 510. It is also contemplated that the window frame 700 may be attached to the topside of the window piece 510 instead of to the bottom side of the window piece 510 as depicted in FIG. 7A.

Figure 7B:
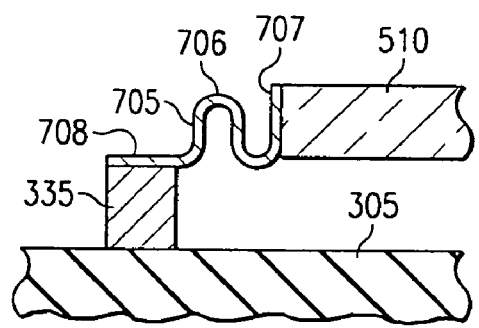
FIG. 7B is a cross-sectional view of a spatial light modulator that incorporates a second window frame embodiment.

In FIG. 7B, a window frame 705 is depicted that connects the window piece 510 to the seal ring 335. Window frame 705 includes a contoured portion 706, an inner portion 707 that is connected to the window piece 510, and an outer portion 708 that is connected to the seal ring 335. Unlike the embodiments depicted in FIGS. 5, 6 and 7A, the inner portion 707 is attached to the side of the window piece 510 instead of to the underside of the window piece 510. This embodiment possesses an advantage in that it provides additional curved portions for relieving mechanical stresses.

Figure 7C:
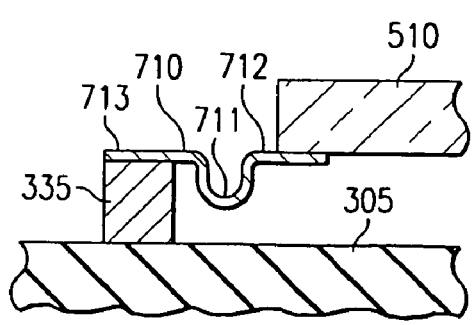
FIG. 7C is a cross-sectional view of a spatial light modulator that incorporates a third window frame embodiment.

In FIG. 7C, a window frame 710 is depicted that connects the window piece 510 to the seal ring 335. Window frame 710 includes a contoured portion in the shape of an inverted "U" 711, an inner portion 712 that is connected to the underside of the window piece 510, and an outer portion 713 that is connected to the seal ring 335. Unlike window frame 505 that is depicted in FIGS. 5 and 6, window frame 710 requires a certain amount of space below it to give the contoured portion 711 clearance above the ceramic base 305. It is also contemplated that the window frame 710 may be attached to the topside of the window piece 510 according to this embodiment.

Figure 7D:
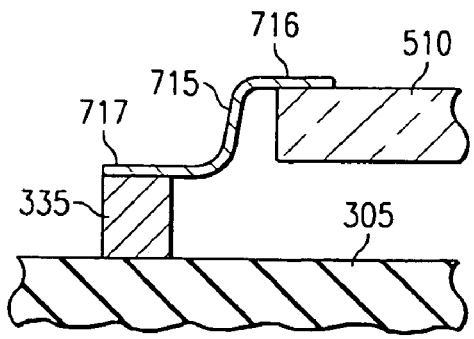
FIG. 7D is a cross-sectional view of a spatial light modulator that incorporates a fourth window frame embodiment.

In FIG. 7D, a window frame 715 is depicted that connects the window piece 510 to the seal ring 335. Although window frame 715 does not include a "U"-shaped contour, it is comprised of a "curved step" contour that acts as a stress relieving feature. Window frame 715 includes an inner portion 716 that is connected to the top-side of the window piece 510, and an outer portion 717 that is connected to the seal ring 335. It is also contemplated that the window frame 715 may be attached to the underside of the window piece 510 according to this embodiment.

Figure 8A:
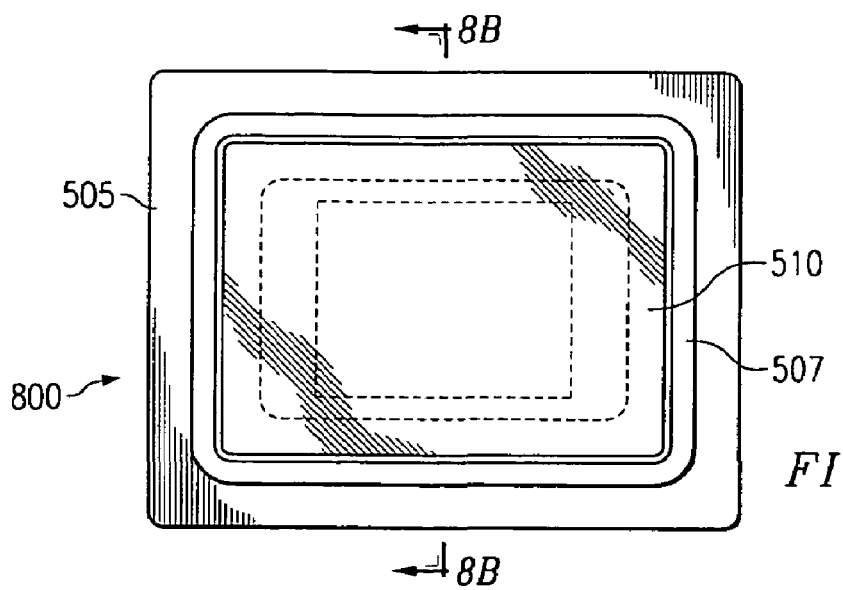
FIG. 8A is a top view of a representative embodiment of a window frame/window piece assembly.
Figure 8B:
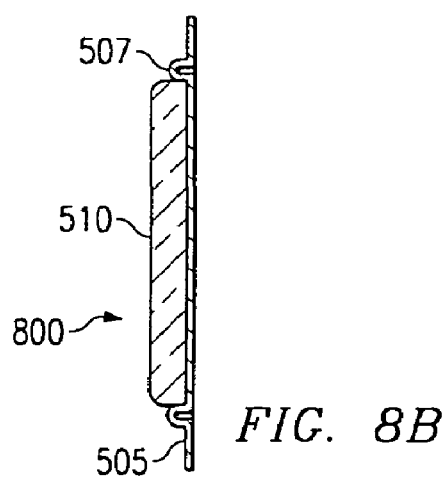
FIG. 8B is a cross-sectional view of a representative embodiment of a window frame/window piece assembly taken along axis A-A.
Figure 8C:
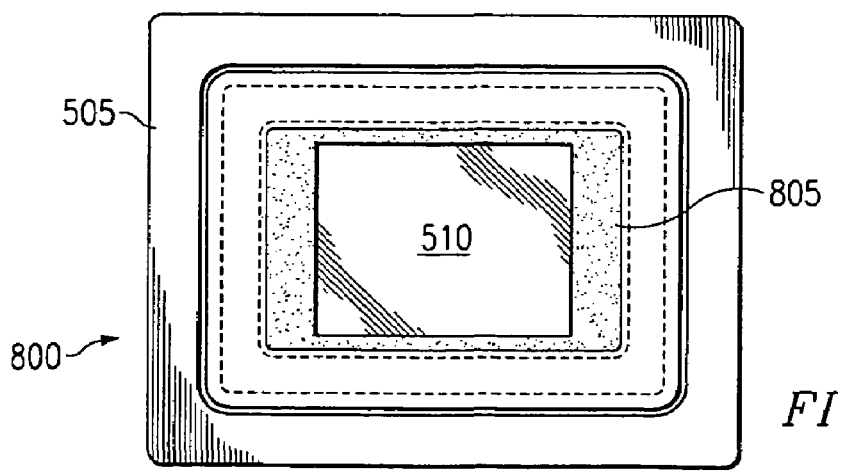
FIG. 8C is a bottom view of a representative embodiment of a window frame/window piece assembly.

A representative embodiment of an window frame/window piece assembly 800 is depicted in FIGS. 8A-8C. In FIG. 8A, a top view of an window frame/window piece assembly 800, which is comprised of an assembled window frame 505 and window piece 510, is depicted. More specifically, the position of the contour 507 with respect to the inner and outer portions of the window frame 505 is illustrated. In addition, the position of the window piece 510 with respect to the window frame 505 is illustrated. Each of the numerical dimensions depicted in FIGS. 8A-8C is in inches with millimeter dimensions in brackets.

FIG. 8B is a cross-sectional view of the window frame/window piece assembly 800 viewed from perspective A-A. In FIG. 8B, the thickness of the window piece 510 is illustrated and the height of the contour 507 is illustrated.

FIG. 8C is a bottom view of the window frame/window piece assembly 800. In FIG. 8C, an opaque material 805 has been applied to a portion of the bottom of the window piece 510. The opaque material 805 is applied to the bottom of the window piece 510 to leave a square-shaped opening in the bottom of the window piece 510. The dimensions of this square-shaped opening as well as its placement with respect to the window frame 505 is illustrated in FIG. 8C.

A representative embodiment of a window frame 505 is depicted in FIGS. 9A-9E. Each of the numerical dimensions depicted in FIGS. 9A-9E is in inches with millimeter dimensions in brackets. The materials comprising the window frame should be selected so that the coefficient of thermal expansion is substantially similar to the coefficient of thermal expansion for the ceramic base and the coefficient of thermal expansion for the window piece. An alloy of Iron-Nickel-Cobalt compliant with ASTM F-15, Mil-I-23011 C, Class 1 (a.k.a. Kovar®) has been found to be an effective alloy for the window frame. Other effective alloys include ASTM F-1684 (96), Mil-I-23011 IC Class 7 (a.k.a. Invar® 36) and ASTM F-30 Mil-I-23011 C Classes 5, 4, 3 and 2 (a.k.a. Alloys 42, 46, 48 and 52, respectively). According to another aspect, the window frame can be stamped from a unitary piece of sheet metal comprised of the Iron-Nickel-Cobalt alloy. According to another aspect, the window frame material will have a surface finish of 32 microinches or better. According to yet another aspect, the window frame material may be plated with gold with a minimum thickness of about 50 microinches over a plating of about 100-300 microinches of electrolytic nickel. The gold coverage should be complete, but unplated areas due to fixturing are permitted along the outer edge of the flange. The nickel plating should conform to AMS-QQ-N-290, class 1, grade G and the gold plating should conform to ASTM-B-488, type 1, grade A. The sharp corners of the window frame should not be broken, except as shown in FIGS. 9A-9E.

Figure 9A:
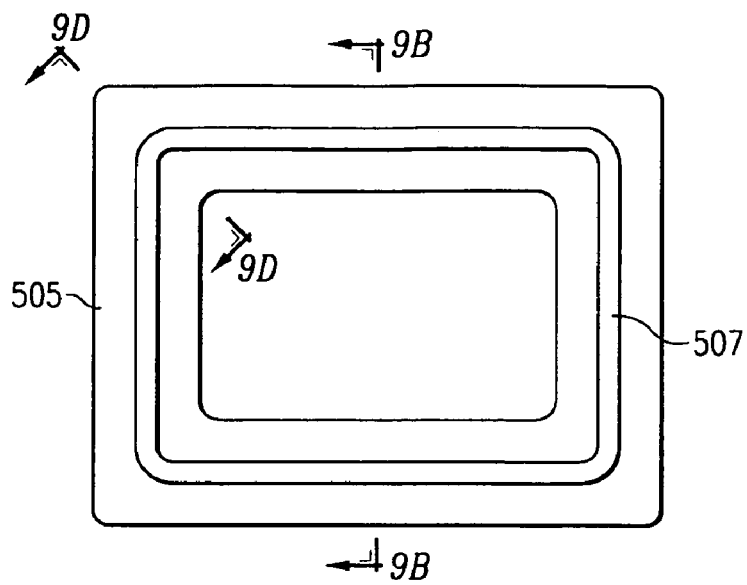
FIG. 9A is a top view of a representative window frame embodiment.

In FIG. 9A, a top view of a window frame 505 is depicted. More specifically, the position of the contour 507 with respect to the inner and outer portions of the window frame 505 is illustrated.

Figure 9B:
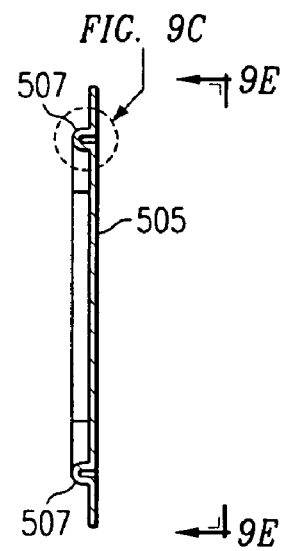
FIG. 9B is a cross-sectional view of a representative window frame embodiment taken along axis A-A.
Figure 9C:
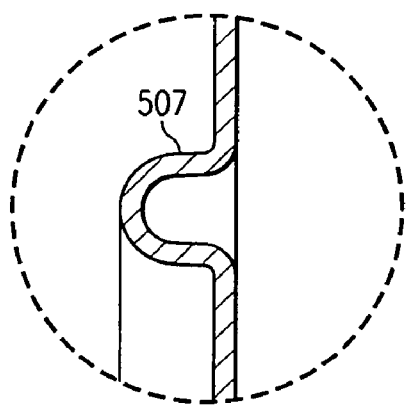
FIG. 9C is a detailed cross-sectional view of a contoured portion that is located in a representative window frame embodiment.

FIG. 9B is a cross-sectional view of the window frame 505 taken along axis A-A. In FIG. 9B, the dimensions of the contour 507, including the radius of curvature at its corners, are illustrated with more specificity. FIG. 9C is a detailed view of area C that is identified in FIG. 9B. Again, the dimensions of the contour 507 is illustrated with more specificity.

Figure 9D:
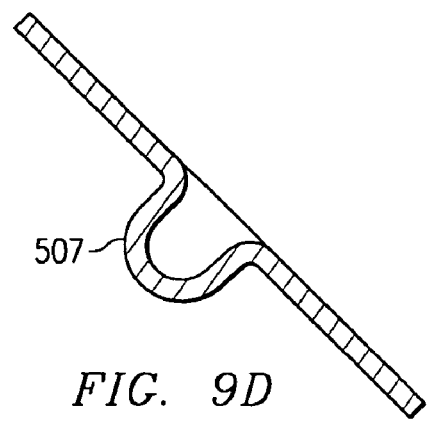
FIG. 9D is a detailed cross-sectional view of a contoured portion window frame taken along axis D-D in a representative window frame embodiment.
Figure 9E:
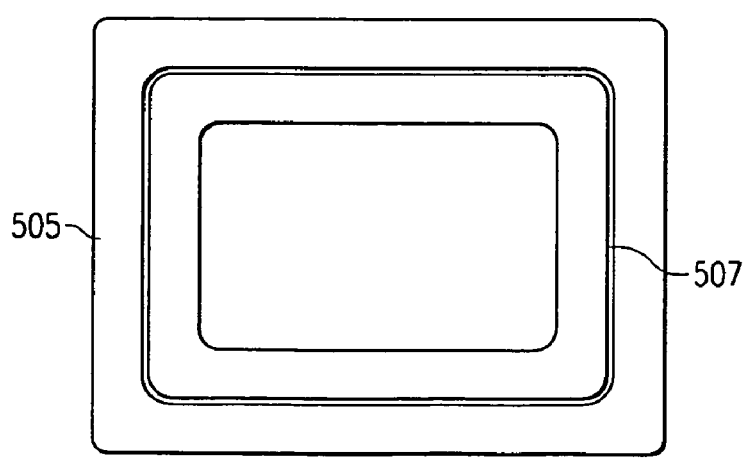
FIG. 9E is a bottom view of a representative window frame embodiment.

FIG. 9D is a cross-sectional view of the window frame 505 taken along axis D-D, which is illustrated in FIG. 9A. In FIG. 9D, the dimensions of the contour 507 are depicted with more specificity. FIG. 9E is a bottom view of the window frame 505 as viewed from perspective B-B, which is depicted in FIG. 9B.

Figure 10A:
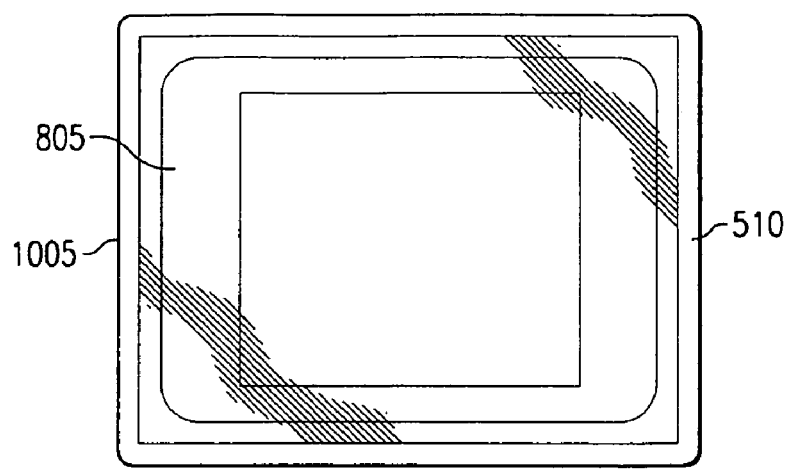
FIG. 10A is a top view of a representative window piece embodiment.
Figure 10B:
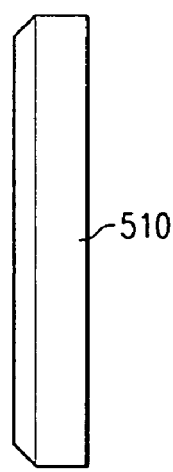
FIG. 10B is a side view of a representative window piece embodiment.
Figure 10C:
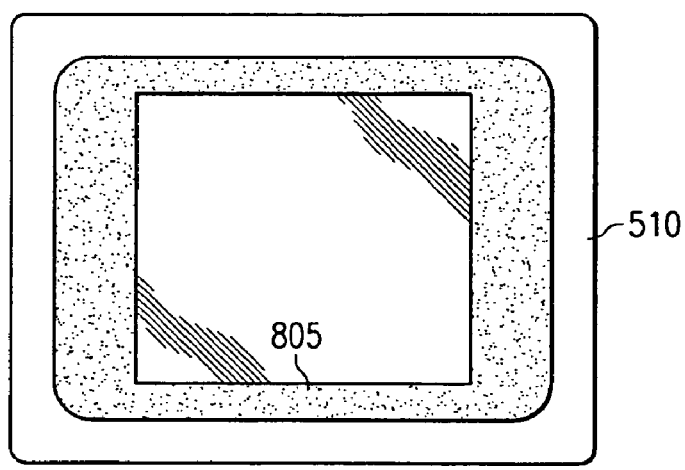
FIG. 10C is a bottom view of a representative window piece embodiment in which the region where the opaque material has been applied is highlighted.

A representative embodiment of a window piece 510 is depicted in FIGS. 10A-10D. Each of the numerical dimensions depicted in FIGS. 10A-10D is in inches with millimeter dimensions in brackets. FIG. 10A is a top view of a representative window piece 510. In FIG. 10A, it can be seen that the top surface has a beveled edge 1005. The opaque material 805 is also visible at the bottom of the representative window piece 510. The dimensions of the representative window piece 510 are also described in detail in FIG. 10A. FIG. 10B is a side view of the representative window piece 510. Again, the dimensions of the representative window piece 510 are depicted in detail in FIG. 10B. Also depicted in FIG. 10B are surface A and surface B, which are located on the bottom and top surfaces of the window piece 510, respectively. FIG. 10C is a bottom view of the window piece 510 in which the placement of the opaque material 805 can be seen in greater detail. In FIG. 10C, the transparent aperture of surface A is defined by the 0.483 and 0.610 dimensions and the transparent aperture of surface B is defined by the 0.683 and 0.810 dimensions. The transparent apertures of surfaces A and B have a flatness of 12 fringes spherical power and 12 fringes irregularity (astigmatism) at 632.8 nm wavelength. The area of the opaque material 805 is defined below for an observer from the top side of the window piece 510. According to yet another aspect, both surfaces A and B have anti-reflective coatings having a photopic reflectance Rphot≦0.5% at normal incidence in air. This anti-reflective coating can be comprised of magnesium fluoride. Furthermore, these coatings should be able to withstand temperatures of 450° C. without delamination or optical degradation.

Figure 10D:
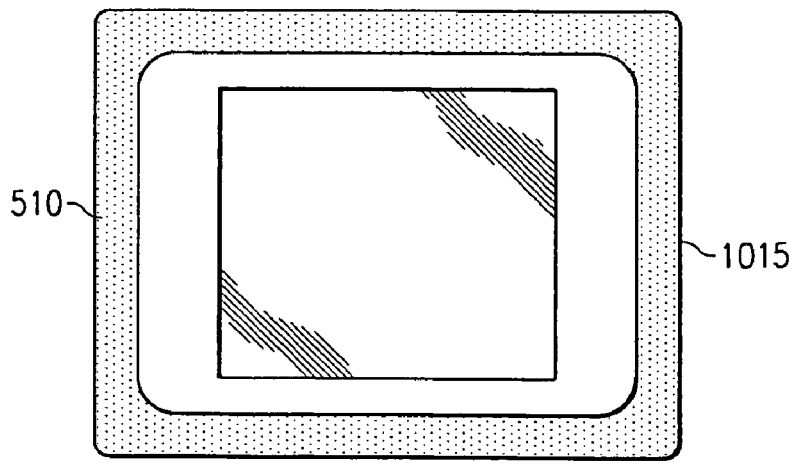
FIG. 10D is a bottom view of a representative window piece embodiment in which the region where the antireflective coating has not been applied is highlighted.

FIG. 10D is a bottom view of the window piece 510 in which the area for omitting the anti-reflective coating 1015 is illustrated in further detail.

Although certain embodiments and aspects of the present inventions have been illustrated in the accompanying drawings and described in the foregoing detailed description, it will be understood that the inventions are not limited to the embodiments disclosed, but are capable of numerous rearrangements, modifications and substitutions without departing from the spirit of the invention as set forth and defined by the following claims and equivalents thereof. Applicant intends that the claims shall not invoke the application of 35 U.S.C § 112, ¶ 6 unless the claim is explicitly written in means-plus-function or step-plus-function format.

We claim:

1. A method for attaching a transparent piece to a substrate assembly comprising a substrate portion, a seal ring, and a micromirror array, the method comprising:

providing a window frame comprising an outer portion, an inner portion substantially perpendicular to the outer portion, and a contoured portion comprising first and second portions formed by stamping a unitary piece of sheet metal, the contoured portion positioned between the inner portion and the outer portion of the window frame, wherein the inner portion and the first portion of the contoured portion define a first partially enclosed space, the first and second portions of the contoured portion define a second partially enclosed space;

mounting the transparent piece to the inner portion of the window frame; and mounting the outer portion of the window frame to the seal ring of the substrate portion.

2. A method according to claim 1 wherein the step of providing a window frame further comprises electroplating the window frame with a nickel alloy.

3. A method according to claim 2 wherein the step of providing a window frame further comprises electroplating the window frame with a gold alloy.

4. A method according to claim 1 wherein the step of mounting the transparent piece comprises brazing the transparent piece and the window frame at a temperature sufficient to form a seal between the pieces.

5. A method according to claim 1 wherein the step of mounting the outer portion of the window frame comprises seam welding the window frame to the seal ring.

6. A method for attaching a transparent piece to a substrate assembly comprising a substrate portion, a seal ring, and a micromirror array, the method comprising:

providing a window frame comprising a substantially planar outer portion, an inner portion substantially perpendicular to the substantially planar outer portion, and a stress relieving means comprising first and second portions positioned between the inner portion and the outer portion of the window frame, wherein the inner portion and the first portion of the stress relieving means define a first partially enclosed space, and the first portion and the second portion of the contoured portion define a second partially enclosed space;

mounting only a sidewall of the transparent piece to the inner portion of the widow frame using a process sufficient to form a seal between the window frame and the transparent piece;

mounting the outer portion of the window frame to the seal ring of the substrate portion by seam welding the window frame to the seal ring of the substrate assembly; and wherein the step of providing a window frame further comprises stamping a unitary piece of sheet metal to form the stress-relieving means and the inner portion.

7. A method according to claim 6 wherein the step of providing a window frame further comprises electroplating the window frame with a nickel alloy.

8. A method according to claim 7 wherein the step of providing a window frame further comprises electroplating the window frame with a gold alloy.

* * * * *